US006331776B1

(12) United States Patent
Debbins et al.

(10) Patent No.: US 6,331,776 B1
(45) Date of Patent: Dec. 18, 2001

(54) MR IMAGING SYSTEM WITH INTERACTIVE MR GEOMETRY PRESCRIPTION CONTROL OVER A NETWORK

(75) Inventors: Josef P. Debbins; Richard J. Prorok, both of Waukesha; William J. Balloni, Menomonee Falls, all of WI (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/453,637

(22) Filed: Dec. 3, 1999

Related U.S. Application Data

(63) Continuation-in-part of application No. 09/200,144, filed on Nov. 25, 1998.

(51) Int. Cl.[7] .................................................. G01V 3/00
(52) U.S. Cl. ............................................ 324/309; 324/307
(58) Field of Search ................................. 324/309, 307, 324/306, 312, 314, 318, 322, 300

(56) References Cited

U.S. PATENT DOCUMENTS

| | | | |
|---|---|---|---|
| 4,830,012 | 5/1989 | Riederer | 128/653 |
| 5,280,428 | 1/1994 | Wu et al. | 364/413.13 |
| 5,345,176 | 9/1994 | LeRoux et al. | 324/309 |

(List continued on next page.)

FOREIGN PATENT DOCUMENTS

WO 98/24058   6/1998  (WO) .

OTHER PUBLICATIONS

Hardy, C. J. et al., Interactive Coronary MRI, Magnetic Resonance in Medicine, Jul. 1998, vol. 40, No. 1, pp. 105–111, Williams & Wilkins.

Wilman, A. H. et al., Arterial Phase Carotid And Vertebral Artery Imaging in 3D Contrast–Enhanced MR Angiography By Combining Fluoroscopic Triggering With An Elliptical Centric Acquisition Order, Magnetic Resonance In Medicine, Jul. 1998, vol. 40, No. 1, pp. 24–35, Williams & Wilkins.

Debbins et al., Cardiac Magnetic Resonance Fluoroscopy, Magnetic Resonance in Medicine, 36:588–595 (1996).

Hangiandreou et al., Interactive Selection of Optimal Section Orientations Using Real–Time MRI, Magnetic Resonance in Medicine, 34:114–119 (1995).

*Primary Examiner*—Louis Arana
(74) *Attorney, Agent, or Firm*—Foley & Lardner; Peter J. Vogel; Michael A. Della Penna

(57) ABSTRACT

A method for prescribing geometry of an imaging volume of a structure of interest positioned in a magnetic resonance (MR) imaging system. The method includes (a) establishing a communication connection over a network between the MR imaging system and a remote facility to provide remote services to the MR imaging systems; (b) selecting a first boundary plane of the structure of interest, wherein the first boundary plane is prescribed by a first imaging section of the structure of interest; (c) determining a first geometry information corresponding to the first imaging section of the structure of interest; (d) storing the first geometry information in the MR imaging system; (e) selecting a second boundary plane of the structure of interest, wherein the second boundary plane is prescribed by a first imaging section of the structure of interest; (f) determining the second geometry information corresponding to the second imaging section of the structure of interest; (g) storing the second geometry information in the MR imaging system; and (h) applying the first and second geometry information of the first and second imaging sections, respectively, to prescribe a boundary geometry defining a subsequent imaging volume of the structure of interest. At least one of steps (b) through (h) is done remotely.

12 Claims, 7 Drawing Sheets

U.S. PATENT DOCUMENTS

| | | | |
|---|---|---|---|
| 5,451,876 | 9/1995 | Sandford et al. | 324/322 |
| 5,498,963 | 3/1996 | Schneider et al. | 324/309 |
| 5,512,826 | 4/1996 | Hardy et al. | 324/309 |
| 5,514,962 | 5/1996 | Cline et al. | 324/309 |
| 5,541,513 | 7/1996 | Maier | 324/309 |
| 5,560,361 | 10/1996 | Glusick | 128/653.2 |
| 5,657,757 | 8/1997 | Hurd et al. | 128/653.2 |
| 5,711,300 | 1/1998 | Schneider et al. | 128/653.2 |
| 5,749,834 | 5/1998 | Hushek | 600/410 |
| 5,810,729 | 9/1998 | Hushek et al. | 600/410 |
| 6,023,635 | 2/2000 | Liu et al. | 600/410 |
| 6,108,573 | 8/2000 | Debbins et al. | 600/410 |
| 6,166,544 | 12/2000 | Debbins et al. | 324/309 |
| 6,275,035 * | 8/2001 | Debbins et al. | 324/307 |

* cited by examiner

MR IMAGING SYSTEM WITH INTERACTIVE MR GEOMETRY PRESCRIPTION CONTROL OVER A NETWORK

CROSS REFERENCE TO RELATED APPLICATIONS

This application is a continuation-in-part (CIP) of U.S. application Ser. No. 09/200,144, entitled "MR IMAGING SYSTEM WITH INTERACTIVE MR GEOMETRY PRESCRIPTION CONTROL" by Josef P. Debbins, Richard J. Prorok and William J. Balloni filed on Nov. 25, 1998.

BACKGROUND OF THE INVENTION

The present invention relates generally to the field of medical diagnostic systems, such as imaging systems. More particularly, the invention relates to a system and technique for accurately and efficiently prescribing the geometry of a subsequent imaging volume of a structure of interest using at least two two-dimensional MR imaging sections as well as a system and technique for retrieving geometry information from a previously prescribed imaging volume and manipulating this geometry information.

When a substance such as human tissue is subjected to a uniform magnetic field (polarizing field Bo), the individual magnetic moments of the spins in the tissue attempt to align with this polarizing field, but process about it in random order at their characteristic Larmor frequency. If the substance, or tissue, is subjected to a magnetic field (excitation field $B_1$) which is the x-y plane and which is near the Larmor frequency, the net aligned moment, $M_z$, may be rotated, or "tipped", into the x-y plane to produce a net transverse magnetic moment M. A signal is emitted by the excited spins after the excitation signal $B_1$ is terminated and this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

When attempting to define the volume of coverage of an MR imaging scan, the NMR system operator may desire to quickly view a preview MR image (such as a real-time MR image) of the anatomical section within this volume of coverage. This process can be particularly useful when prescribing a three dimensional imaging volume, in which the desired high spatial resolution requires the thinnest slab possible. It is desirable to position this thin slab such that the anatomical section within the volume of coverage is complete, i.e. for example, covers the entire desired vascular network. Thus, a quick view of each side of the slab prior to initiating the three dimensional acquisition is useful for insuring that the entire anatomical section desired is within the defined volume of coverage.

Typically, two dimensional axial, sagittal and/or coronal "scout" images are first acquired. Such scout images are stored for later use. To use, the operator calls up the scout image and either graphically or explicitly (using geometry coordinates) prescribes the imaging volume directly on the scout images. The imaging volume may be either a two dimensional stack of slices or a three dimensional slab of the structure of interest. The drawback of this technique is that the operator does not actually see the results of the prescribed geometry until the subsequent imaging volume is acquired. Prescription errors cannot be detected nor corrected until the imaging volume acquisition is complete. Thus, when prescription errors exist, the operator is required to re-prescribe and re-acquire the imaging volume of the desired anatomical section.

Solutions to the problems described above have not heretofore included significant remote capabilities. In particular, communication networks, such as, the Internet or private networks, have not been used to provide remote services to such medical diagnostic systems. The advantages of remote services, such as, remote monitoring, remote system control, immediate file access from remote locations, remote file storage and archiving, remote resource pooling, remote recording, remote diagnostics, and remote high speed computations have not heretofore been employed to solve the problems discussed above.

Thus, there is a need for a medical diagnostic system which provides for the advantages of remote services and addresses the problems discussed above. In particular, there is a need for accurately and efficiently prescribing the geometry of a subsequent imaging volume of a structure of interest using at least two two-dimensional MR imaging sections over a network from a remote location. Further, there is a need for retrieving geometry information from a previously prescribed imaging volume and manipulating this geometry information over a network. Even further, there is a need for manipulation of MR imaging systems remotely via a network.

SUMMARY OF THE INVENTION

One embodiment of the invention relates to a method for prescribing geometry of an imaging volume of a structure of interest positioned in a magnetic resonance (MR) imaging system. The method includes (a) establishing a communication connection over a network between the MR imaging system and a remote facility to provide remote services to the MR imaging system; (b) selecting a first boundary plane of the structure of interest, wherein the first boundary plane is prescribed by a first imaging section of the structure of interest; (c) determining a first geometry information corresponding to the first imaging section of the structure of interest; (d) storing the first geometry information in the MR imaging system; (e) selecting a second boundary plane of the structure of interest, wherein the second boundary plane is prescribed by a first imaging section of the structure of interest; (f) determining the second geometry information corresponding to the second imaging section of the structure of interest; (g) storing the second geometry information in the MR imaging system; and (h) applying the first and second geometry information of the first and second imaging sections, respectively, to prescribe a boundary geometry defining a subsequent imaging volume of the structure of interest. At least one of steps (b) through (h) is done remotely.

Another embodiment of the invention relates to a method for retrieving geometry prescription of an imaging volume of a structure of interest positioned in a magnetic resonance (MR) imaging system. The method includes (a) establishing a communication connection over a network between the MR imaging system and a remote facility to provide remote services to the MR imaging system; (b) selecting a previously prescribed imaging volume of the structure of interest; (c) determining a first and second geometry information representing a first and second boundary planes, respectively, of the previously prescribed imaging volume;

(d) loading the first and second geometry information representing the first and second boundary planes, respectively, in at least one buffer; and (e) storing the first and second geometry information representing the first and second boundary planes of the previously prescribed imaging volume in the MR imaging system. At least one of steps (b) through (e) is done remotely.

Another embodiment of the invention relates to a magnetic resonance (MR) imaging system for prescribing geometry of an imaging volume of a structure of interest, including: (a) means for establishing a communication connection over a network between the MR imaging system and a remote facility to provide remote services to the MR imaging system; (b) means for selecting a first boundary plane of the structure of interest, wherein the first boundary plane is prescribed by a first imaging section of the structure of interest; (c) means for determining a first geometry information corresponding to the first imaging section of the structure of interest; (d) means for storing the first geometry information in the MR imaging system; (e) means for selecting a second boundary plane of the structure of interest, wherein the second boundary plane is prescribed by a first imaging section of the structure of interest; (f) means for determining the second geometry information corresponding to the second imaging section of the structure of interest; (g) means for storing the second geometry information in the MR imaging system; and (h) means for applying the first and second geometry information of the first and second imaging sections, respectively, to prescribe a boundary geometry defining a subsequent imaging volume of the structure of interest. At least one of the means (b) through (h) is located remotely.

Another embodiment of the invention relates to a magnetic resonance (MR) imaging system capable of retrieving geometry prescription of an imaging volume of a structure of interest, including: (a) means for establishing a communication connection over a network between the MR imaging system and a remote facility to provide remote services to the MR imaging system; (b) means for selecting a previously prescribed imaging volume of the structure of interest; (c) means for determining a first and second geometry information representing a first and second boundary planes, respectively, of the previously prescribed imaging volume; (d) means for loading the first and second geometry information representing the first and second boundary planes, respectively, in at least one buffer; and (e) means for storing the first and second geometry information representing the first and second boundary planes of the previously prescribed imaging volume in the MR imaging system. At least one of the means (b) through (e) is located remotely.

Another embodiment of the invention relates to a magnetic resonance (MR) imaging system for prescribing geometry of an imaging volume of a structure of interest. The system includes a MR imaging device, a network coupling the MR imaging device and a remote facility, an operator interface, and a computer system. The MR imaging device is configured to acquire and reconstruct MR data in real-time of at least one first and second imaging section of the structure of interest in real-time and display at least one first and second imaging section of the structures of interest in real-time. The network provides remote services to the MR imaging device. The operator interface is configured to transmit at least one selection signal in response to an operator selecting a first boundary plane of the structure of interest on the operator interface, wherein the first boundary plane is prescribed by the first imaging section of the structure of interest, and the operator selecting a second boundary plane of the structure of interest on the operator interface, wherein the second boundary plane is prescribed by the second imaging section of the structure of interest. The computer system is coupled to the operator interface and the network, wherein the computer system is configured to determine a first and second geometry information corresponding to the first and second imaging sections, respectively, of the structure of interest, in response to the at least one selection signal, and wherein the computer system is configured to store the first and second geometry information in the MR imaging system.

Another embodiment of the invention relates to a magnetic resonance (MR) imaging system capable of retrieving geometry prescription of an imaging volume of a structure of interest. The system includes a computer system, a network coupling the computer system and a remote facility, an operator interface, and a system control. The computer system is configured to store at least one previously prescribed imaging volume of the structure of interest. The network provides remote services to the computer system. The operator interface is coupled to the computer system and is configured to transmit at least one selection signal in response to an operator selecting the at least one previously prescribed imaging volume of the structure of interest on the operator interface. The system control is coupled to the computer system, the network, and the operator interface, wherein, in response to the at least one selection signal from the operator interface, the computer system determines a first and second geometry information representing a first and second boundary planes, respectively, of the previously prescribed imaging volume, and stores the first and second geometry information representing the first and second boundary planes, respectively, in the system control, wherein the operator interface includes an electronic display configured to display the first and second geometry information.

Other principle features and advantages of the present invention will become apparent to those skilled in the art upon review of the following drawings, the detailed description, and the appended claims.

BRIEF DESCRIPTION OF THE DRAWINGS

The invention will become more fully understood from the following detailed description, taken in conjunction with the accompanying drawings, wherein like reference numerals refer to like parts, in which.

DETAILED DESCRIPTION OF THE PREFERRED EMBODIMENT

Figure 1:
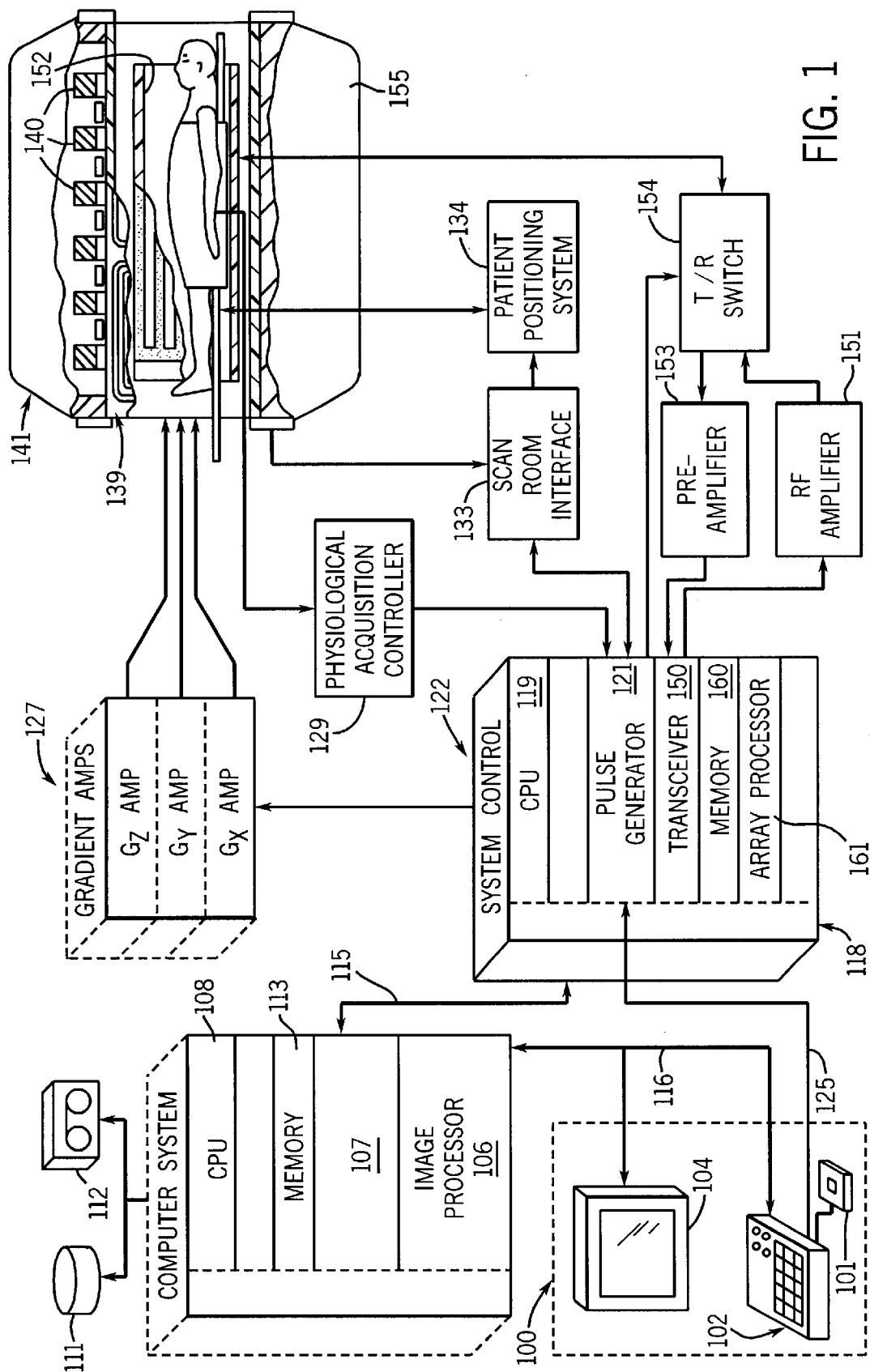
FIG. 1 is a block diagram of a MR imaging system which employs a preferred embodiment of the invention.

Referring first to FIG. 1, there is shown the major components of a preferred MR imaging system which incorporates the present invention. The operation of the system is controlled from an operator console 100 which includes an input device 101, a control panel 102 and a display 104. The console 100 communicates through a link 116 with a separate computer system 107 that enables an operator to control the production and display of images on the display 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a wholebody RF coil 152.

A transceiver module 150 in the system control 122 produces pulses which are amplified by an RF amplifier 151 and coupled to the RF coil 152 by a transmit/receiver switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
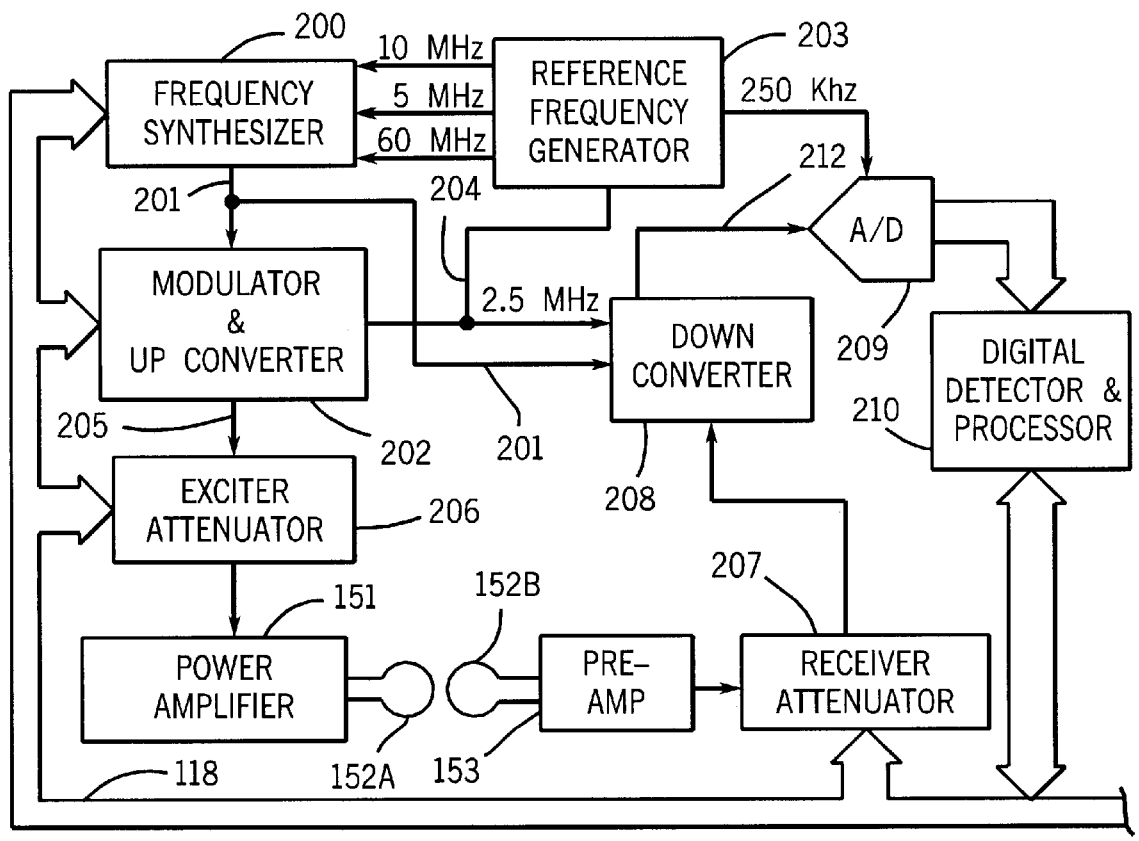
FIG. 2 is an electrical block diagram of the transceiver which forms part of the MR imaging system of FIG. 1.

Referring particularly to FIGS. 1 and 2, the transceiver 150 produces the RF excitation field $B_1$ through power amplifier 151 at a coil 152A and receives the resulting signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200 which receives a set of digital signals (CF) from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command, TA, from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIGS. 1 and 2 the NMR signal produced by the subject is picked up by the receiver coil 152B and applied through the preamplifier 153 to the input of a receiver attenuator 207. The receiver attenuator 207 further amplifies the signal by an amount determined by a digital attenuation signal (RA) received from the backplane 118.

The received signal is at or around the Larmor frequency, and this high frequency signal is down converted in a two step process by a down converter 208 which first mixes the NMR signal with the carrier signal on line 201 and then mixes the resulting difference signal with the 2.5 MHz reference signal on line 204. The down converted NMR signal is applied to the input of an analog-to-digital (A/D) converter 209 which samples and digitizes the analog signal and applies it to a digital detector and signal processor 210 which produces 16 bit in-phase (I) values and 16-bit quadrature (Q) values corresponding to the received signal. The resulting stream of digitized I and Q values of the received signal are output through backplane 118 to the memory module 160 where they are normalized in accordance with the present invention and then employed to reconstruct an image.

The 2.5 MHz reference signal as well as the 250 kHz sampling signal and the 5, 10 and 60 MHz reference signals are produced by a reference frequency generator 203 from a common 20 MHz master clock signal. For a more detailed description of the receiver, reference is made to U.S. Pat. No. 4,992,736 which is incorporated herein by reference.

In one embodiment of the preferred embodiment, an operator interactively prescribes geometry to define a subsequent MR imaging volume or receives geometry information from a previously defined MR imaging volume of the structure of interest, such as an anatomical structure. Such interactive geometry prescription is accomplished from the operator console 100 (also referred to as an operator interface) using the input device 101. The input device 101 is selected from a group including, but not limited to, a mouse, a joystick, a keyboard, a track ball, a touch screen, a light wand, and a voice control. The MR imaging system of the present invention is capable of imaging in any desired orientation within the structure of interest and is equipped to perform both real-time acquisitions and non real-time acquisitions. In particular, real-time refers to continuous acquisition and reconstruction of MR image data as rapidly as it is acquired. A real-time MR image can be acquired and displayed in approximately one second or less, as constrained by MR imaging system performance.

Figure 3:
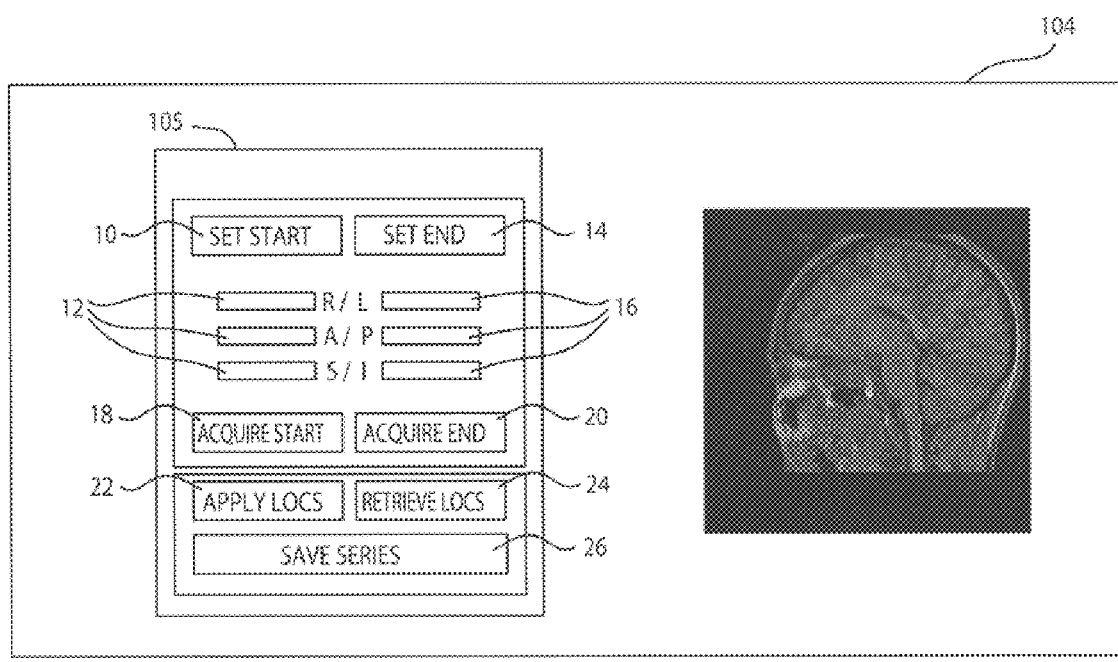
FIG. 3 is an illustration of the graphical user interface on the display screen of the operator console of the MR imaging system of FIG. 1.

FIG. 3 shows a graphical user interface 105 used in an embodiment of the present invention. The graphical user interface 105 and the MR image of the structure of interest is displayed on the display 104 (also referred to as an electronic display) of the MR imaging system. The operator interacts with the graphical user interface 105 using the input device 101. The graphical user interface 105 includes a set start boundary icon 10, a three-point start boundary geometry icon 12, a set end boundary icon 14, and a three-point end boundary geometry icon 16. The three-point start and end boundary geometry icons 12, 16, respectively, each contain geometry coordinates defining the location of a planar section of the structure of interest in the imaging volume. These coordinates are defined in the patient right-left direction (R/L), patient anterior-posterior direction (A/P), and patient superior-inferior direction (S/I), hereafter referred to as center point RAS coordinates. The graphical user interface 105 also includes an acquire start boundary icon 18, an acquire end boundary icon 20, an apply location icon 22, a retrieve location icon 24, and a save series icon 26.

First, to prescribe the boundary geometry of a subsequent or proposed imaging volume, it is desirable for the operator to view real-time imaging sections, preferably two dimensional planar sections, corresponding to the boundaries defining the desired subsequent imaging volume prior to committing to those imaging sections as the boundaries of the subsequent imaging volume. Typically the operator maneuvers the MR imaging system to acquire and display a real-time imaging section on display 104 directed to the structure of interest that defines one boundary of the desired subsequent imaging volume. The operator then registers this real-time imaging section as one boundary plane of the subsequent imaging volume by "clicking" on the set start boundary icon 10 on the graphical user interface 105. A geometry representation of the scan plane of this imaging section is determined and stored (i.e. in a text buffer) as text in center point RAS coordinates. The geometry representation of the start boundary is also displayed in the three-point start boundary geometry icon 12 of the graphical user interface 105.

Next, the operator manipulates the MR imaging system to acquire and display another real-time imaging section on display 104 directed to the structure of interest that defines another boundary of the desired subsequent imaging volume. The operator registers this current real-time imaging section as another boundary plane of the subsequent imaging volume by clicking on the set end boundary icon 14 on the graphical user interface 105. Similar to above, a geometry representation of the scan plane of this current imaging section is determined, stored, and displayed in center point RAS coordinates in the three-point end boundary geometry icon 16 of the graphical user interface 105.

It should be understood that non real-time imaging sections can also be utilized to set the start and end boundaries. The advantage of the real-time imaging sections is that the operator can very rapidly view multiple imaging sections of interest for the purposes of prescribing the subsequent imaging volume. Additionally, the operator can repeatedly set the start and/or end boundary planes by acquiring and displaying a new imaging section and then clicking on the set start boundary icon 10 or the set end boundary icon 14, as desired. In this way, the present embodiment provides the operator with a finer degree of geometry prescription control.

The remaining boundary geometry defining the subsequent imaging volume can be identical to the corresponding boundaries of the current real-time imaging section, i.e., the in-plane field of view. Alternatively, the remaining boundary geometry can be defined independently with additional icons on the graphical user interface 105 using the input device 101 (not shown in FIG. 3). Still further, in the case where the two boundary planes are not parallel to each other, the MR imaging system can apply a best fit algorithm, or other suitable algorithms, to the start and end boundaries to calculate the remaining boundary geometry.

The operator may now click on the apply location icon 22, which transfers the start and end boundary geometry information contained in icons 12, 16 to the subsequent imaging volume. Once the start and end boundary geometry information has been applied, the operator can click on the save series icon 26. This signals the MR imaging system to check for a complete boundary geometry prescription and prepares the system for acquisition of the prescribed imaging volume.

Second, to retrieve the boundary geometry of a previously prescribed or defined imaging volume and to utilize the retrieved geometry information to check the prescribed boundary geometry or to use it as a starting point from which to prescribe a subsequent imaging volume, the operator starts by selecting a previously prescribed imaging volume from a list or display of one or more previously prescribed imaging volumes on display 104 (not shown in FIG. 3). The previously prescribed imaging volumes may be, but is not limited to, previously stored real-time acquisitions, previously stored non real-time acquisitions, or previously stored graphically or explicitly (using geometry coordinates) prescribed imaging volumes from scout images. Then the operator clicks on the retrieve location icon 24 to load boundary geometry information, in center point RAS coordinates, into the buffers corresponding to icons 12, 16. Icons 12, 16 displays the two boundary plane geometry information.

Using the acquire start boundary icon 18 or the acquire end boundary icon 20, the operator commands the MR imaging system to acquire and display a real-time imaging section, typically a two-dimensional planer section, defined by the retrieved geometry information in the three-point start boundary geometry icon 12 or the three-point end boundary geometry icon 16, respectively. Alternatively, the retrieved geometry information may be used to acquire and display a non real-time imaging section. The feature embodied in the acquire start and end boundary icons 18, 20 are particularly useful for checking or previewing the boundaries of a previously prescribed imaging volume that has not been acquired, such as an imaging volume prescribed using scout images.

In another embodiment of the preferred embodiment, the imaging section acquired and displayed as a result of clicking the acquire start or end boundary icon 18, 20 may be modified such that an acquisition of a new imaging section occurs and the said section is displayed (replacing the current imaging section displayed). The modification, for example, may be accomplished by graphically or explicitly (using geometry coordinates) changing the scan plane of the currently imaging section. This new imaging section, in turn, may be utilized to replace the retrieved geometry information stored in icon 12 or 16 by clicking on the set start or end boundary icon 10 or 14, respectively. Thus, in this manner, the geometry information of a previously prescribed imaging volume may be used as a starting point from which to prescribe a subsequent imaging volume or to refine the prescription of a previously prescribed imaging volume.

Figure 4:
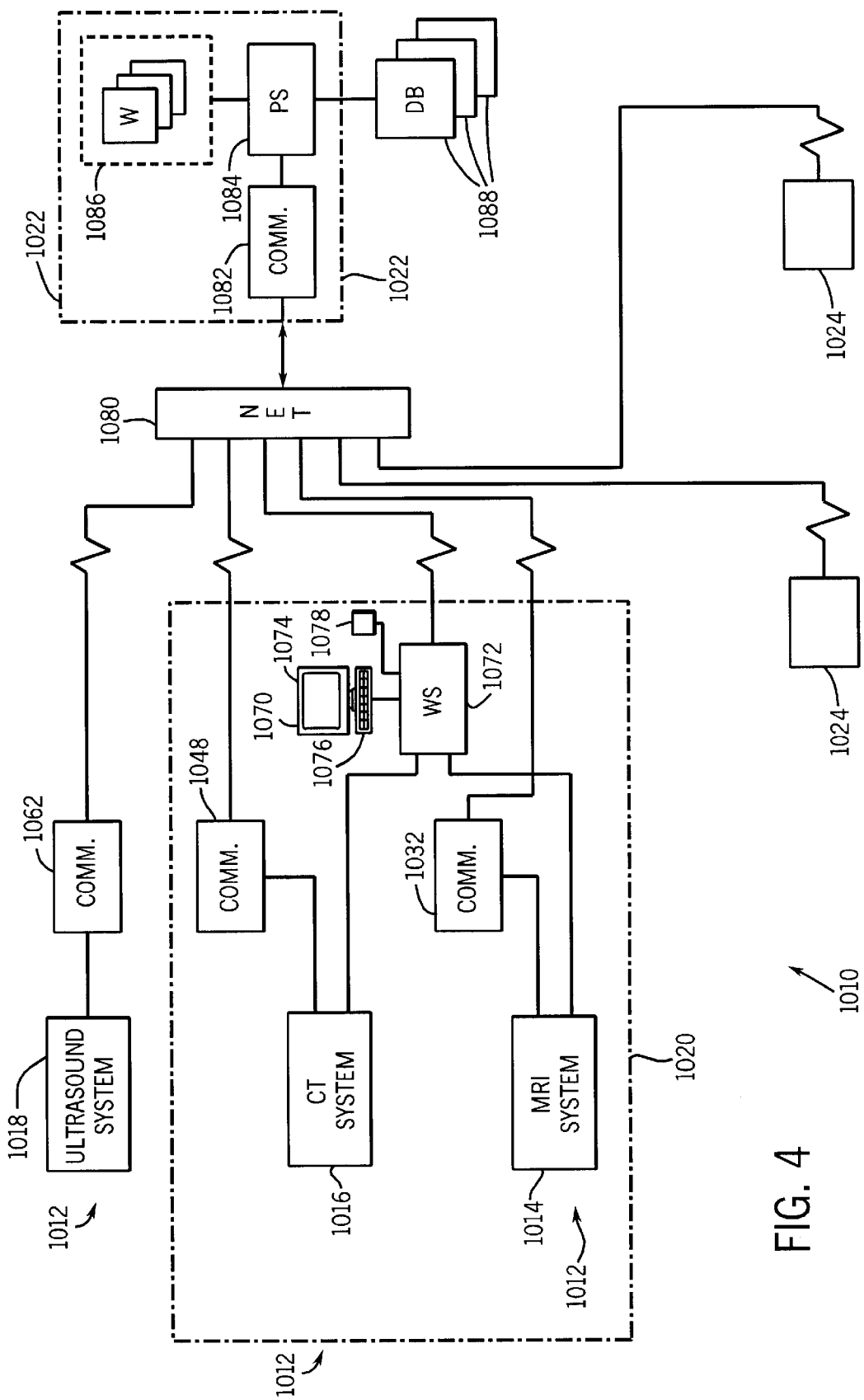
FIG. 4 is a diagrammatical representation of a series of medical diagnostic systems coupled to a service facility via a network connection for providing remote services and data interchange between the diagnostic systems and the service facility.

Referring now to FIG. 4, a service system 1010 is illustrated for providing remote service to a plurality of medical diagnostic systems 1012, including systems such as the MR imaging system described with reference to FIG. 1. In the embodiment illustrated in FIG. 4, the medical diagnostic systems include a magnetic resonance imaging (MRI) system 1014, a computed tomography (CT) system 1016, and an ultrasound imaging system 1018. The diagnostic systems may be positioned in a single location or facility, such as a medical facility 1020, or may be remote from one another as shown in the case of ultrasound system 1018. The diagnostic systems are serviced from a centralized service facility 1022. Moreover, a plurality of field service units 1024 may be coupled in the service system for transmitting service requests, verifying service status, transmitting service data and so forth as described more fully below.

In the exemplary embodiment of FIG. 4, several different system modalities are provided with remote service by the service facility. Remote services include but are not limited to services, such as, remote monitoring, remote system control, immediate file access from remote locations, remote file storage and archiving, remote resource pooling, remote recording, and remote high speed computations. Remote services are provided to a particular modality depending upon the capabilities of the service facility, the types of diagnostic systems subscribing to service contracts with the facility, as well as other factors.

Depending upon the modality of the systems, various subcomponents or subsystems will be included. In the case of MRI system 1014, such systems will generally include a scanner, a control and signal detection circuit, a system controller, and an operator station. MRI system 1014 includes a uniform platform for interactively exchanging service requests, messages and data with service facility 1022 as described more fully below. MRI system 1014 is linked to a communications module 1032, which may be included in a single or separate physical package from MRI system 1014. In a typical system, additional components may be included in system 1014, such as a printer or photographic system for producing reconstructed images based upon data collected from the scanner.

Similarly, CT system 1016 will typically include a scanner, a signal acquisition unit, and a system controller. The scanner detects portions of x-ray radiation directed through a subject of interest. The controller includes circuitry for commanding operation of the scanner and for processing and reconstructing image data based upon the acquired signals. CT system 1016 is linked to a communications module 1048 for transmitting and receiving data for remote services. Moreover, like MRI system 1014, CT system 1016 will generally include a printer or similar device for outputting reconstructed images based upon data collected by the scanner.

In the case of ultrasound system 1018, such systems will generally include a scanner and data processing unit and a system controller. Ultrasound system 1018 is coupled to a communications module 1062 for transmitting service requests, messages and data between ultrasound system 1018 and service facility 1022.

Although reference is made herein generally to "scanners" in diagnostic systems, that term should be understood to include medical diagnostic data acquisition equipment generally, not limited to image data acquisition, as well as to picture archiving communications and retrieval systems, image management systems, facility or institution management systems, viewing systems and the like, in the field of medical diagnostics.

Where more than one medical diagnostic system is provided in a single facility or location, as indicated in the case of MRI and CT systems 1014 and 1016 in FIG. 4, these may be coupled to a management station 1070, such as in a radiology department of a hospital or clinic. The management station may be linked directly to controllers for the various diagnostic systems. The management system may include a computer workstation or personal computer 1072 coupled to the system controllers in an intranet configuration, in a file sharing configuration, a client/server arrangement, or in any other suitable manner. Moreover, management station 1070 will typically include a monitor 1074 for viewing system operational parameters, analyzing system utilization, and exchanging service requests and data between the facility 1020 and the service facility 1022. Input devices, such as a standard computer keyboard 1076 and mouse 1078, may also be provided to facilitate the user interface.

It should be noted that, alternatively, the management system, or other diagnostic system components, may be "stand-alone" or not coupled directly to a diagnostic system. In such cases, the service platform described herein, and some or all of the service functionality nevertheless be provided on the management system. Similarly, in certain applications, a diagnostic system may consist of a stand-alone or networked picture archiving communications and retrieval system or a viewing station provided with some or all of the functionality described herein.

The communication modules mentioned above, as well as workstation 1072 and field service units 1024 may be linked to service facility 1022 via a remote access network 1080. For this purpose, any suitable network connection may be employed. Presently preferred network configurations include both proprietary or dedicated networks, as well as open networks, such as the Internet. Data may be exchanged between the diagnostic systems, field service units, and remote service facility 1022 in any suitable format, such as in accordance with the Internet Protocol (IP), the Transmission Control Protocol (TCP), or other known protocols. Moreover, certain of the data may be transmitted or formatted via markup languages such as the HyperText Markup Language (HTML), or other standard languages. The presently preferred interface structures and communications components are described in greater detail below.

Within service facility 1022, messages, service requests and data are received by communication components as indicated generally at reference numeral 1082. Components 1082 transmit the service data to a service center processing system, represented generally at reference numeral 1084 in FIG. 4. The processing system manages the receipt, handling and transmission of service data to and from the service facility. In general, processing system 1084 may include one or a plurality of computers, as well as dedicated hardware or software servers for processing the various service requests and for receiving and transmitting the service data as described more fully below.

Service facility 1022 also includes a bank of operator workstations 1086 which may be staffed by personnel who address the service requests and provide off and on-line service to the diagnostic systems in response to the service requests. Also, processing system 1084 may be linked to a system of databases or other processing systems 1088 at or remote from the service facility 1022. Such databases and processing systems may include extensive database information on operating parameters, service histories, and so forth, both for particular subscribing scanners, as well as for extended populations of diagnostic equipment.

Figure 5:
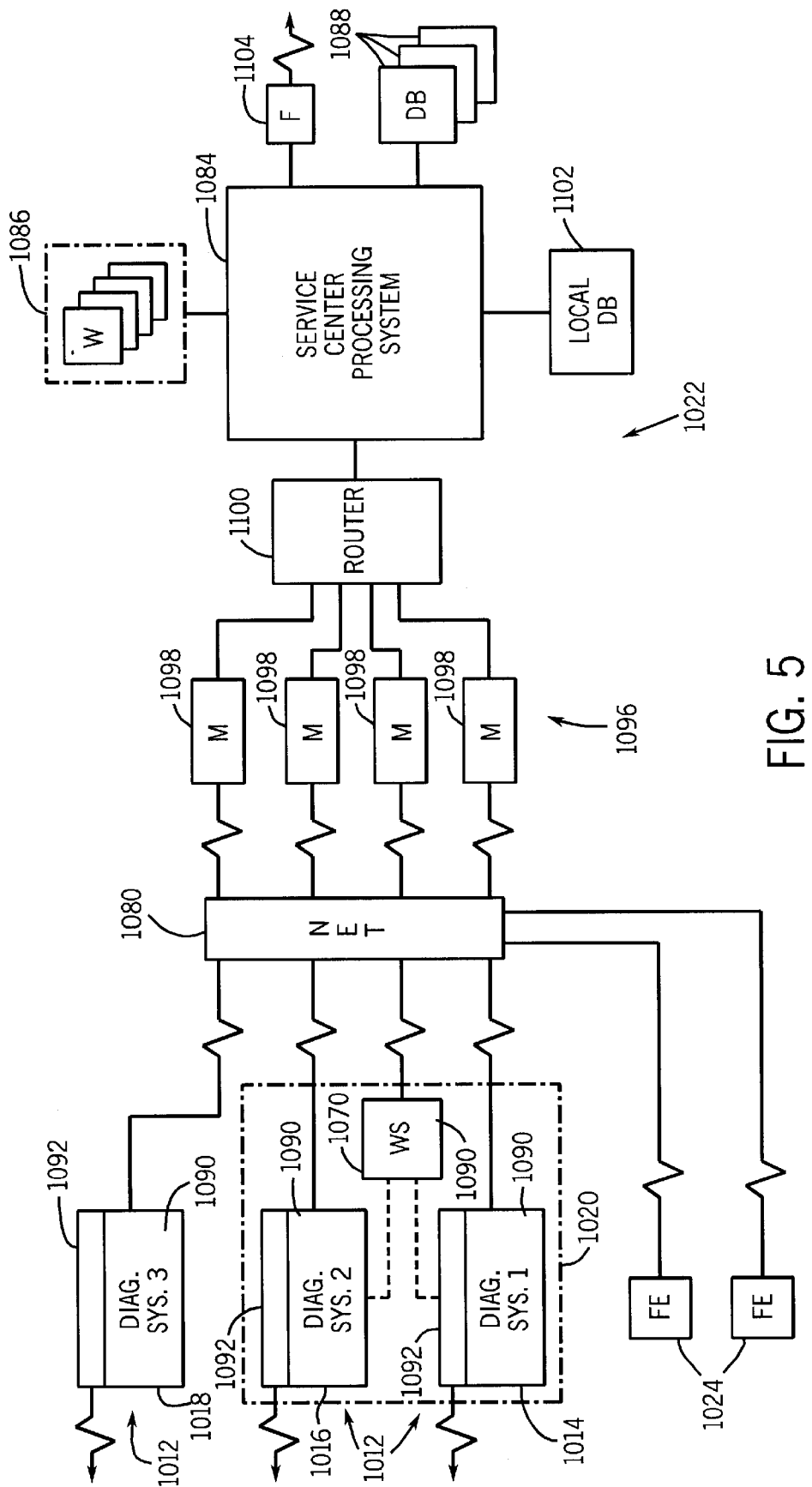
FIG. 5 is a block diagram of the systems shown in FIG. 4 illustrating certain functional components of the diagnostic systems and the service facility.

FIG. 5 is a block diagram illustrating the foregoing system components in a functional view. As shown in FIG. 5, the field service units 1024 and the diagnostic systems 1012 can be linked to the service facility 1022 via a network connection as illustrated generally at reference numeral 1080. Within each diagnostic system 1012, a uniform service platform 1090 is provided.

Platform 1090, which is described in greater detail below with particular reference to FIG. 6, includes hardware, firmware, and software components adapted for composing service requests, transmitting and receiving service data, establishing network connections and managing financial or subscriber arrangements between diagnostic systems and the service facility. Moreover, the platforms provide a uniform graphical user interface at each diagnostic system, which can be adapted to various system modalities to facilitate interaction of clinicians and radiologists with the various diagnostic systems for service functions. The platforms enable the scanner designer to interface directly with the control circuitry of the individual scanners, as well as with memory devices at the scanners, to access image, log and similar files needed for rendering requested or subscribed services. Where a management station 1070 is provided, a similar uniform platform is preferably loaded on the management station to facilitate direct interfacing between the management station and the service facility. In addition to the uniform service platform 1090, each diagnostic system is preferably provided with an alternative communications module 1092, such as a facsimile transmission module for sending and receiving facsimile messages between the scanner and remote service facilities.

Messages and data transmitted between the diagnostic systems and the service facility traverse a security barrier or "firewall" contained within processing system 1084 as discussed below, which prevents unauthorized access to the service facility in a manner generally known in the art. A modem rack 1096, including a series of modems 1098, receives the incoming data, and transmits outgoing data through a router 1100 which manages data traffic between the modems and the service center processing system 1084.

In the diagram of FIG. 5, operator workstations 1086 are coupled to the processing system, as are remote databases or computers 1088. In addition, at least one local service database 1102 is provided for verifying license and contract arrangements, storing service record files, log files, and so forth. Moreover, one or more communication modules 1104 are linked to processing system 1084 to send and receive facsimile transmissions between the service facility and the diagnostic systems or field service units.

Figure 6:
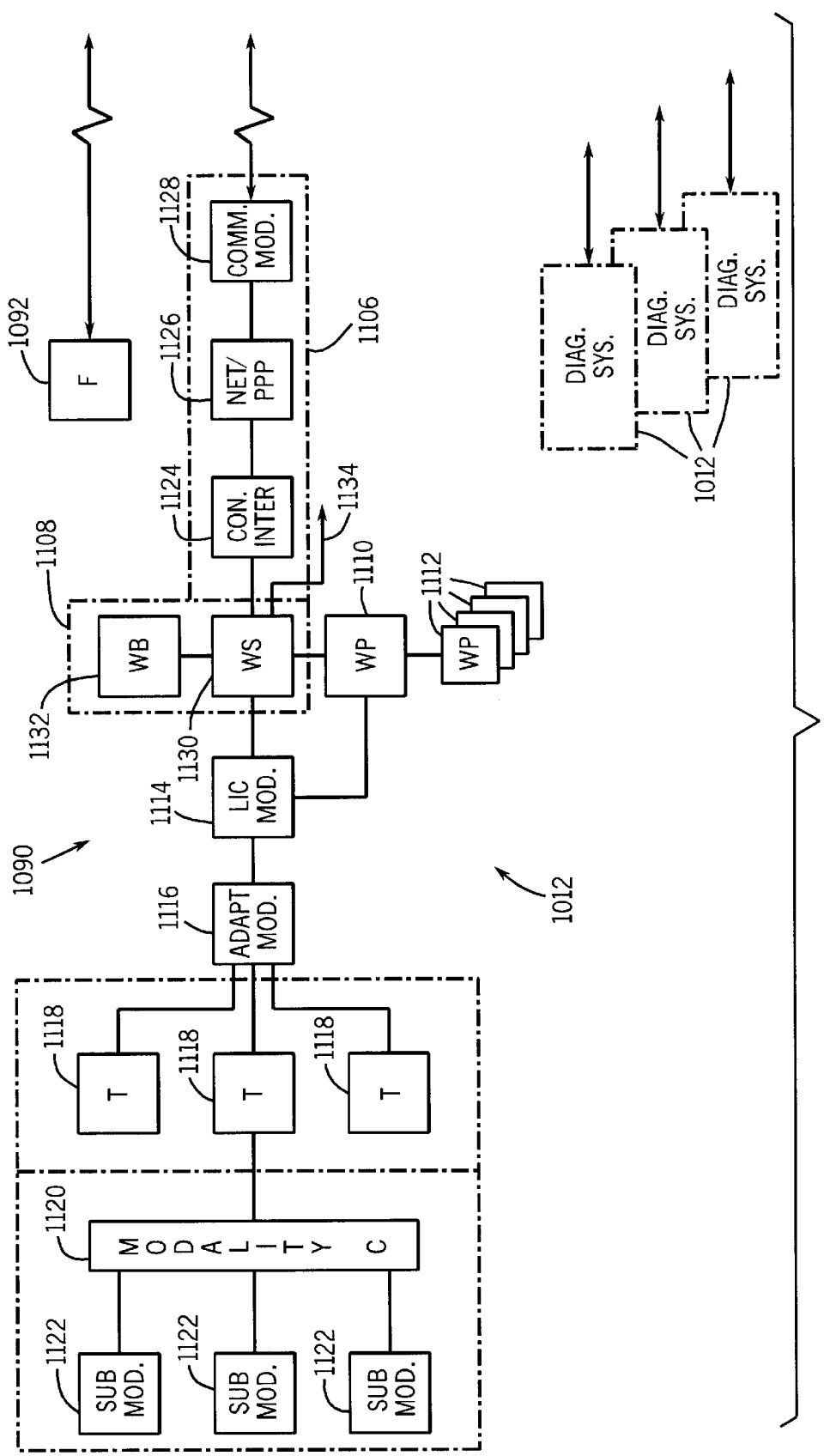
FIG. 6 is a block diagram of certain functional components within a diagnostic system of the type shown in FIG. 4 and FIG. 5 for facilitating interactive remote servicing of the diagnostic system.

FIG. 6 illustrates diagrammatically the various functional components comprising the uniform service platform 1090 within each diagnostic system 1012. As shown in FIG. 6, the uniform platform includes a device connectivity module 1106, as well as a network connectivity module 1108. Network connectivity module 108 accesses a main web page 110 which, as mentioned above, is preferably a markup language page, such as an HTML page displayed for the system user on a monitor at the diagnostic system. Main web page 1110 is preferably accessible from a normal operating page in which the user will configure examination requests, view the results of examinations, and so forth such as via an on-screen icon. Through main web page 1110, a series of additional web pages 1112 are accessible. Such web pages permit remote service requests to be composed and transmitted to the remote service facility, and facilitate the exchange of other messages, reports, software, protocols, and so forth as described more fully below.

It should be noted that as used herein the term "page" includes a user interface screen or similar arrangement which can be viewed by a user of the diagnostic system, such as screens providing graphical or textual representations of data, messages, reports and so forth. Moreover, such pages may be defined by a markup language or a programming language such as Java, perl, java script, or any other suitable language.

Network connectivity module 1108 is coupled to a license module 1114 for verifying the status of license, fee or contractual subscriptions between the diagnostic system and the service facility. As used herein, the term "subscription" should be understood to include various arrangements, contractual, commercial or otherwise for the provision of services, information, software, and the like, both accompanies with or without payment of a fee. Moreover, the particular arrangements manages by systems as described below may include several different types of subscriptions, including time-expiring arrangements, one-time fee arrangements, and so-called "pay per use" arrangements, to mention but a few.

License module 1114 is, in turn, coupled to one or more adapter utilities 1116 for interfacing the browser, server, and communications components with modality interface tools 1118. In a presently preferred configuration, several such interface tools are provided for exchanging data between the system scanner and the service platform. For example, modality interface tools 11 18 may include applets or servlets for building modality-specific applications, as well as configuration templates, graphical user interface customization code, and so forth. Adapters 1116 may interact with such components, or directly with a modality controller 1120 which is coupled to modality-specific subcomponents 1122.

The modality controller 1120 and modality-specific subcomponents 1122 will typically include a preconfigured processor or computer for executing examinations, and memory circuitry for storing image data files, log files, error files, and so forth. Adapter 1116 may interface with such circuitry to convert the stored data to and from desired protocols, such as between the HyperText Transfer Protocol (HTTP) and DICOM, a medical imaging standard for data presentation. Moreover, transfer of files and data as described below may be performed via any suitable protocol, such as a file transfer protocol (FTP) or other network protocol.

In the illustrated embodiment, device connectivity module 1106 includes several components for providing data exchange between the diagnostic system and the remote service facility. In particular, a connectivity service module 1124 provides for interfacing with network connectivity module 1108. A Point-to-Point Protocol (PPP) module 1126 is also provided for transmitting Internet Protocol (IP) packets over remote communication connections. Finally, a modem 1128 is provided for receiving and transmitting data between the diagnostic system and the remote service facility. As will be appreciated by those skilled in the art, various other network protocols and components may be employed within device connectivity module 1106 for facilitating such data exchange.

Network connectivity module 1108 preferably includes a server 1130 and a browser 1132. Server 1130 facilitates data exchange between the diagnostic system and the service facility, and permits a series of web pages 1110 and 1112 to be viewed via browser 1132. In a presently preferred embodiment, server 1130 and browser 1132 support HTTP applications and the browser supports java applications. Other servers and browsers, or similar software packages may, of course, be employed for exchanging data, service requests, messages, and software between the diagnostic system, the operator and the remote service facility. Finally, a direct network connection 1134 may be provided between server 1130 and an operator workstation, such as management station 1070 within the medical facility (see FIGS. 4 and 5).

In a present embodiment, the components comprising network connectivity module may be configured via an application stored as part of the uniform platform. In particular, a Java application licensed to a service engineer enables the engineer to configure the device connectivity at the diagnostic system to permit it to connect with the service facility.

Figure 7:
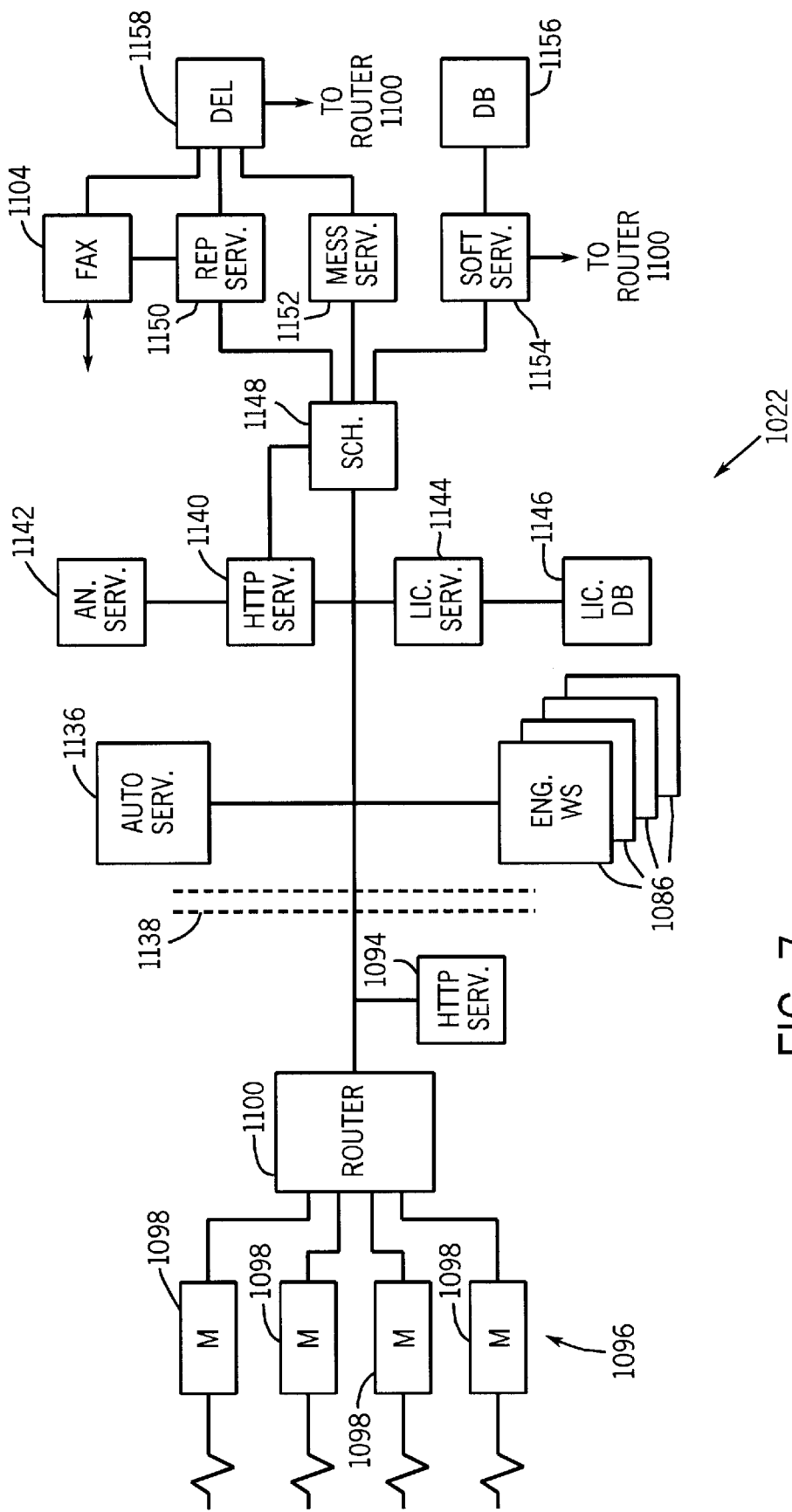
FIG. 7 is a block diagram of certain of the functional components of the service facility illustrated in FIG. 4 and FIG. 5 for rendering interactive remote service to a plurality of medical diagnostic systems.

FIG. 7 illustrates exemplary functional components for service facility 1022. As indicated above, service facility 1022 includes a modem rack 1096 comprising a plurality of modems 1098 coupled to a router 1100 for coordinating data communications with the service facility. An HTTP service server 1094 receives and directs incoming and outgoing transactions with the facility. Server 1094 is coupled to the other components of the facility through a firewall 1138 for system security. Operator workstations 1086 are coupled to the port manager for handling service requests and transmitting messages and reports in response to such requests.

An automated service unit 1136 may also be included in the service facility for automatically responding to certain service requests, sweeping subscribing diagnostic systems for operational parameter data, and so forth, as described below. In a presently preferred embodiment, the automated service unit may operate independently of or in conjunction with the interactive service components comprising processing system 1084. It should be noted that other network or communications schemes may be provided for enabling the service facility to communicate and exchange data and messages with diagnostic systems and remote service units, such as systems including outside Internet service providers (ISP's), virtual private networks (VPN's) and so forth.

Behind firewall 1138, an HTTP application server 1140 coordinates handling of service requests, messaging, reporting, software transfers and so forth. Other servers may be coupled to HTTP server 1140, such as service analysis servers 1142 configured to address specific types of service requests, as described more fully below. In the illustrated embodiment, processing system 1084 also includes a license server 1144 which is coupled to a license database 1146 for storing, updating and verifying the status of diagnostic system service subscriptions. Alternatively, where desired, license server 1144 may be placed outside of fire wall 1138 to verify subscription status prior to admission to the service facility.

Handling of service requests, messaging, and reporting is further coordinated by a scheduler module 1148 coupled to HTTP server 1140. Scheduler module 1148 coordinates activities of other servers comprising the processing system, such as a report server 1150, a message server 1152, and a software download server 1154. As will be appreciated by those skilled in the art, servers 1150, 1152 and 1154 are coupled to memory devices (not shown) for storing data such as addresses, log files, message and report files, applications software, and so forth. In particular, as illustrated in FIG. 7, software server 1154 is coupled via one or more data channels to a storage device 1156 for containing transmittable software packages which may be sent directly to the diagnostic systems, accessed by the diagnostic systems, or supplied on pay-per-use or purchase basis. Message and report servers 1152 and 1154 are further coupled, along with communications module 1104, to a delivery handling module 1158, which is configured to receive outgoing messages, insure proper connectivity with diagnostic systems, and coordinate transmission of the messages.

In a presently preferred embodiment, the foregoing functional circuitry may be configured as hardware, firmware, or software on any appropriate computer platform. For example, the functional circuitry of the diagnostic systems may be programmed as appropriate code in a personnel computer or workstation either incorporated entirely in or added to the system scanner. The functional circuitry of the service facility may include additional personal computers or workstations, in addition to a main frame computer in which one or more of the servers, the scheduler, and so forth, are configured. Finally, the field service units may comprise personal computers or laptop computers of any suitable processor platform. It should also be noted that the foregoing functional circuitry may be adapted in a variety of manners for executing the functions described herein. In general, the functional circuitry facilitates the exchange of remote service data between the diagnostic systems and a remote service facility, which is preferably implemented in an interactive manner to provide regular updates to the diagnostic systems of service activities.

As described above, both the diagnostic systems and the field service units preferably facilitate interfacing between a variety of diagnostic system modalities and the remote service facility via a series of interactive user-viewable pages. Exemplary pages include capabilities of providing interactive information, composing service requests, selecting and transferring messages, reports and diagnostic system software, and so forth. Pages facilitate the interaction and use of remote services, such as, remote monitoring, remote system control, immediate file access from remote locations, remote file storage and archiving, remote resource pooling, remote recording, and remote high speed computations.

The user can access specific documents described in text areas of the pages by selection of all or a portion of the text describing the documents. In the presently preferred embodiment, the accessed documents may be stored in local memory devices within the diagnostic system, or selection of the text may result in loading of a uniform resource locator (URL) for accessing a remote computer or server via a network link.

Service system 1010 (FIG. 4) provides remote services, such as, remote control, remote diagnostics, and remote servicing. Advantageously, service system 1010 (FIG. 4) allows the MRI system described with reference to FIG. 1 to be controlled from a remote location. As such, skilled system operators or physicians may operate the MRI system without either the physician travelling to the patient or the patient travelling to the physician. In particular, service system 1010 provides for accurately and efficiently prescribing the geometry of a subsequent imaging volume of a structure of interest using at least two two-dimensional MR imaging sections as well as retrieving geometry information from a previously prescribed imaging volume and manipulating this geometry information over a network.

Service system 1010 also allows the MRI system to be serviced by a remote facility. As such, calibration, software upgrades, and other service operations are available via the network.

While the embodiments illustrated in the Figures and described above are presently preferred, it should be understood that the embodiments are offered by way of example only. Other embodiments may include, for example, setting the start or end boundary described herein may be accomplished directly by inputting geometry coordinates rather than by displaying an imaging section and extracting or determining geometry coordinates therefrom. The invention is not limited to a particular embodiment, but extends to various modifications, combinations, and permutations that nevertheless fall within the scope and spirit of the appended claims.

What is claimed is:

1. A magnetic resonance (MR) imaging system for prescribing geometry of an imaging volume of a structure of interest, comprising:

a MR imaging device configured to acquire and reconstruct MR data in real-time of at least one first and second imaging section of the structure of interest in real-time and displaying at least one first and second imaging section of the structures of interest in real-time;

a network coupling the MR imaging device and a remote facility, the network providing remote services to the MR imaging device;

an operator interface configured to transmit at least one selection signal in response to an operator selecting a first boundary plane of the structure of interest on the operator interface, wherein the first boundary plane is prescribed by the first imaging section of the structure of interest, and the operator selecting a second boundary plane of the structure of interest on the operator interface, wherein the second boundary plane is prescribed by the second imaging section of the structure of interest; and a computer system coupled to the operator interface and the network, wherein the computer system is configured to determine a first and second geometry information corresponding to the first and second imaging sections, respectively, of the structure of interest, in response to the at least one selection signal, and wherein the computer system is configured to store the first and second geometry information in the MR imaging system.

2. The system of claim 1, wherein the remote services comprise upgrading MR imaging system software, remotely controlling operation of the MR imaging system, performing remote diagnostics, and providing remote servicing of the MR imaging system.

3. The system of claim 1, wherein the operator interface includes an electronic display configured to display the first and second imaging sections of the structure of interest.

4. The system of claim 1, wherein the operator interface includes an electronic display configured to display the first and second geometry information.

5. The system of claim 1, wherein the subsequent imaging volume is selected from a group including a three-dimensional MR acquisition and a stack of a plurality of two-dimensional MR acquisitions.

6. The system of claim 1, further comprising a system control configured to receive an initiation signal from the operator interface to initiate the acquisition of the subsequent imaging volume using the boundary geometry prescribed by the first and second geometry information.

7. The system of claim 6, wherein the acquired imaging volume is a MR scan selected from a group including a real-time acquisition and a non real-time acquisition.

8. The system of claim 1, wherein at least one of the imaging section is a planar section from a group including a real-time acquisition and a non real-time acquisition.

9. The system of claim 1, wherein the operator interface includes an input device selected from a group including a mouse, a joystick, a keyboard, a trackball, a touch screen, a light wand, and a voice control.

10. The system of claim 1, wherein the first and second boundary planes are parallel to each other.

11. The system of claim 1, wherein the remaining boundaries defining the subsequent imaging volume is prescribed by the in-plane field of view of at least one imaging section.

12. The system of claim 1, wherein remaining boundaries defining the proposed imaging volume is prescribed by a best-fit algorithm applied to the first and second boundary planes.

* * * * *

UNITED STATES PATENT AND TRADEMARK OFFICE
CERTIFICATE OF CORRECTION

PATENT NO. : 6,331,776 B1
DATED : December 18, 2001
INVENTOR(S) : Josef P. Debbins et al.

It is certified that error appears in the above-identified patent and that said Letters Patent is hereby corrected as shown below:

Column 12,
Lines 45-46, delete "accompanies" and substitute -- accompanied --;
Line 47, delete "manages" and substitute -- managed --;
Line 58, delete "11 18" and substitute -- 1118 --;

Column 16,
Line 41, delete "section" and substitute -- sections --.

Signed and Sealed this

Eleventh Day of June, 2002

*Attest:*

JAMES E. ROGAN
*Attesting Officer*   *Director of the United States Patent and Trademark Office*